(12) United States Patent
Archbold et al.

(10) Patent No.: US 7,185,018 B2
(45) Date of Patent: Feb. 27, 2007

(54) METHOD OF STORING AND RETRIEVING MINIATURIZED DATA

(75) Inventors: John Archbold, Hampton (AU); Graziano Mele, Southport (AU)

(73) Assignee: Zentronix Pty Limited, Hampton (AU)

( * ) Notice: Subject to any disclaimer, the term of this patent is extended or adjusted under 35 U.S.C. 154(b) by 115 days.

(21) Appl. No.: 10/168,439

(22) PCT Filed: Dec. 21, 2000

(86) PCT No.: PCT/AU00/01594

§ 371 (c)(1),
(2), (4) Date: Oct. 11, 2002

(87) PCT Pub. No.: WO01/48593

PCT Pub. Date: Jul. 5, 2001

(65) Prior Publication Data

US 2003/0093418 A1 May 15, 2003

(30) Foreign Application Priority Data

Dec. 23, 1999 (AU) .................................. PQ4865

(51) Int. Cl.
*G06F 7/00* (2006.01)
*G06F 17/30* (2006.01)

(52) U.S. Cl. .................. 707/101; 707/4; 707/102
(58) Field of Classification Search ............. 707/3, 707/101, 102, 103 R; 709/203; 715/532; 382/232
See application file for complete search history.

(56) References Cited

U.S. PATENT DOCUMENTS 4,724,523 A * 2/1988 Kucera ..................... 715/532
4,809,350 A * 2/1989 Shimoni et al. ............ 382/238
5,748,780 A * 5/1998 Stolfo ....................... 382/232
5,831,558 A    11/1998 Harvell
5,832,219 A * 11/1998 Pettus ....................... 709/203
5,895,463 A     4/1999 Dowling et al.
5,953,723 A *  9/1999 Linoff et al. ............... 707/102

(Continued)

OTHER PUBLICATIONS de Moura, Edleno S. et al.; "Indexing Compressed Text"; 1997, *Proceedings of the Fourth South American Workshop on String Processing*, vol. 8, 17 pages.
de Moura, Edleno S.; "Fast and Flexible Word Searching on Compressed Text", 2000, *ACM Transactions on Information Systems*, vol. 18, No. 2, pp. 113-139.

(Continued)

Primary Examiner—Jeffrey Gaffin
Assistant Examiner—Susan Y. Chen
(74) Attorney, Agent, or Firm—Philip H. Albert; Townsend and Townsend and Crew

(57) ABSTRACT

A method of storing data including the steps of providing a first index of first location identifiers, a second index of second location identifiers and a dictionary data base of data items, wherein the first location identifiers are adapted to identify the location of second location identifiers in the second index and the second location identifiers are adapted to identify the location of data items in the dictionary data base, receiving data and separating the data into a plurality of data items and storing the data items in a main data base, whereby at least one of the data items is stored in the main data base as at least one first location identifier, which identifies at least one second location identifier, which identifies the or each data item in the dictionary data base.

8 Claims, 1 Drawing Sheet

Figure 1:
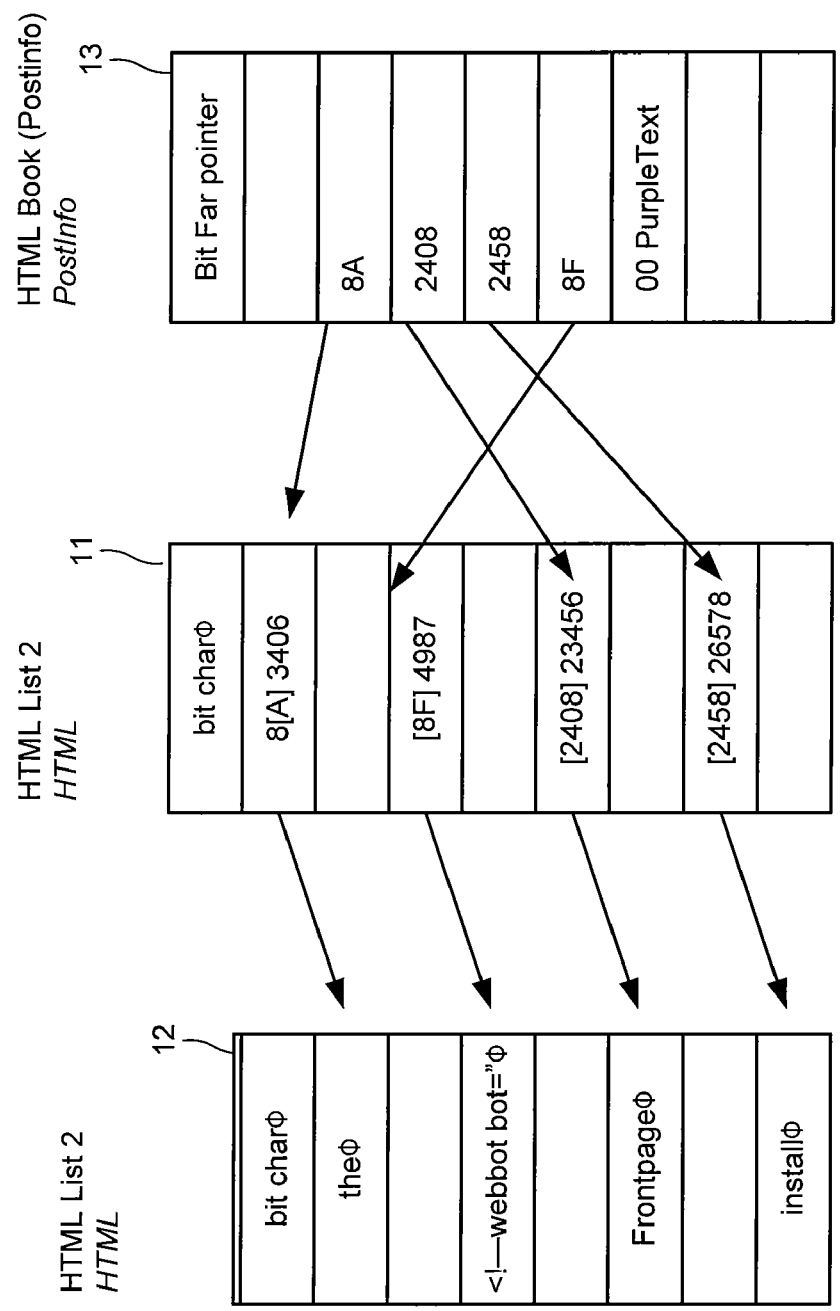

U.S. PATENT DOCUMENTS 5,970,177 A         10/1999    Chinnock
6,073,135 A *        6/2000    Broder et al. ................ 707/100
6,175,835 B1 *       1/2001    Shadmon .................... 707/102
6,434,561 B1 *       8/2002    Durst et al. ................... 707/10
6,578,046 B2 *       6/2003    Chang et al. ........... 707/103 R

OTHER PUBLICATIONS

Manber, Udi; "A Text Compression Scheme that allows fast searching directly in the compressed file"; 1993, *Technical report #93-07, University of Arizona*, pp. 1-12.

"C Library to search over compressed texts"; 2000, http://Roquefort.di.unipi.it/ferrax/CompressedSearch/, 6 pages.

* cited by examiner

METHOD OF STORING AND RETRIEVING MINIATURIZED DATA

FIELD OF THE INVENTION

The present invention relates primarily, although not exclusively, to techniques used for storing electronic data in a form which requires less storage space.

BACKGROUND OF THE INVENTION

A typical method for compressing data involves the use of a dictionary data base which lists commonly occurring data and replaces this commonly occurring data with a coded "token" which effectively represents that data using a reduced number of data bits.

Whenever an item of data occurs repeatedly this data item is replaced by its equivalent "token" and accordingly that data item is stored in a compressed form.

When data is stored in the compressed form, by using a look-up table each token can be replaced by its equivalent data item so that the original data can be reformed.

The above conventional compression technique has a number of drawbacks. These drawbacks include the number of data bits which are required to represent a token can also be significant with the result that significant storage space is required to store each token. In addition searching a data base which includes tokens can be quite cumbersome because tokens need to be reconverted to their original data item before a search of each of the data items can be properly conducted.

OBJECT OF THE INVENTION

The present invention provides an alternative to existing methods of storing data in a miniaturised form and extends to methods for encrypting data as well as systems for implementing the method, computer programs and storage medium for storing electronic data which is able to implement the method and system.

DISCLOSURE OF THE INVENTION

According to the present invention there is provided a method of storing data including the steps of providing a first index of first location identifiers, a second index of second location identifiers and a dictionary data base of data items, wherein the first location identifiers are adapted to identify the location of second location identifiers in the second index and the second location identifiers are adapted to identify the location of data items in the dictionary data base, receiving data and separating the data into a plurality of data items and storing the data items in a main data base, whereby at least one of the data items is stored in the main data base as at least one first location identifier, which identifies at least one second location identifier, which identifies the or each data item in the dictionary data base.

According to another aspect of the present invention there is provided a method of retrieving data stored in a miniaturised form in a main data base, including the steps of accessing the main data base, retrieving one or more items of data including at least one first location identifier from the main data base, using the first location identifier to access and retrieve the location of a second location identifier identified in the first index by the first location identifier, accessing and retrieving from the second location identifier in the second index the location of an item of data in a dictionary data base.

It is preferred that the method of storing data includes the step of searching the dictionary data base for at least one data item and replacing the data item with one first location identifier which indicates the location of one location identifier in the second index, which second location identifier indicates the location of the data item in the dictionary data base.

It is preferred that the method includes the step of searching the dictionary data base for each data item and identifying if the data item occurs in the dictionary data base and if the data item occurs in the dictionary data base, retrieving the second location identifier in the second index that identifies the location of the data item in the dictionary data base, retrieving the first location identifier in the first index which identifies the location of the second location identifier in the second index and storing the first location identifier in a main data base in place of the data item.

It is preferred that the data item includes a string of data, a field of data or other group of data that can represent information in a predetermined format.

The or each data item preferably represents a stream of data which represents information which can be searched.

Each data item preferably represents a name, initial, address, phone number or other words or numbers or initials or characters or character strings or number strings.

Each first location identifier preferably includes a pointer to the second index.

Each second location identifier may include a pointer to the dictionary data base.

The first index may comprise a plurality of pointers.

Preferably the second index comprises a plurality of pointers.

The first index may comprise a sequential list of pointers.

The second index may comprise a sequential list of pointers.

The dictionary data base preferably includes a plurality of data bases each with unique addresses which are represented by the location identifiers.

Each index may include a plurality of sub-indexes.

Preferably each second index is divided into different sections representing locations of predetermined types of data items.

Each first index is preferably divided into different sections representing the location of second location identifiers associated with predetermined types of data items.

The method may include providing additional indexes with additional location identifiers.

According to another aspect of the present invention there is provided a system for storing data, the system including at least one dictionary data base and at least two index data bases wherein the dictionary data base comprises a plurality of data items, a first one of the index data bases comprising a plurality of data item location identifiers, which respectively identify the location of at least one data item in the dictionary data base and a second one of the index data bases including a plurality of first location identifiers which respectively identify the location of at least one data item location identifier in the first index data base, and wherein the system includes a processing means which is adapted to receive data including data items and to store the data in a compressed form by storing in place of each data item occurring in the dictionary data base, each corresponding first location identifier, whereby each data item occurring in the dictionary data base can be retrieved by referencing the data item location identifier identified by the first location identifier.

Preferably the at least two index databases include separate lists of location identifiers in a common data base or which are part of other data bases.

Preferably there is provided a storage medium including a sequence of instructions adapted to control a data processor to set up the system.

The first index data base may be part of the dictionary data base.

The system may include one or more additional index data bases each with location identifiers which identify the location of another location identifier of another index data base.

It is preferred that the system includes a main data base which is adapted to store a stream of data as a combination of data items which are not represented in the dictionary data base and first location identifiers.

According to one embodiment the stream of data stored in the main data base may have data items and first location identifiers which are stored in an order determined by a further index data base and a reprocessing means which is adapted to control the ordering of data in the main data base with reference to the further index data base.

Preferably the dictionary data base has data items stored in a predetermined order which is determined by how commonly or frequently each data item stored therein is expected to occur in a data stream of data items.

It is preferred that the most common data items have a location in the dictionary data base that is identified by a dictionary data base location identifier having minimal bits compared to an uncommon data item.

Preferably the dictionary data base index comprises dictionary data base location identifiers arranged sequentially from lowest number to highest number of bits required to define them.

Each first location identifier may comprise a pointer having a number which identifies a position of one data item location identifier in the dictionary data base index.

Preferably each data item location identifier comprises a pointer having a number which identifies the position of one data item in the dictionary data base.

The dictionary data base may be divided into different sections which have data items with locations which are identified by data item location identifiers from different dictionary data base indexes.

The dictionary data base preferably includes storage space into which data items can be added.

According to another aspect of the present invention there is provided a computer program which is adapted to control a computer to provide at least one dictionary data base and at least two index data bases, wherein the dictionary data base comprises a plurality of data items, a first one of the index data bases comprises a plurality of data item location identifiers, which respectively identify the location of at least one data item in the dictionary data base, and a second one of the index data bases includes a plurality of first location identifiers which respectively identify the location of at least one data item location identifier in the first index data base, and wherein the computer program includes instructions to control the computer to receive data including data items and to store the data in a compressed form by storing in place of each data item which occurs in the dictionary data base, each corresponding first location identifier, whereby each data item which occurs in the dictionary data base can be retrieved by referencing the data item location identifier identified by the first location identifier.

Preferably the at least two index data bases include separate lists of location identifiers in a common data base or which are part of other data bases.

The first index data base may be part of the dictionary data base.

It is preferred that the computer program includes an exception means for storing data items which do not occur in the dictionary data base.

The exception means preferably includes a predetermined part of the dictionary data base.

The exception means may be adapted to provide a dictionary index location identifier for any new data item stored in the dictionary data base.

According to another embodiment of the present invention the exception means includes an exceptions data base which is adapted to store data items which do not occur in the dictionary data base.

The computer program may include a means for storing different types of data items in different dictionary data bases.

Each dictionary data base may have predetermined dictionary location identifiers in the first one of the index data bases, which provide the location of data items in that data base.

Each dictionary data base may be split into a plurality of data types or fields each having a plurality of data items of that type or field.

According to another aspect of the present invention there is provided a storage medium having computer software stored thereon which is adapted to control a computer to set up a system according to any one of the previously described embodiments of the invention.

According to another aspect of the present invention there is provided a system for retrieving data items stored in a miniaturised form, the system including at least one dictionary data base and at least two index data bases wherein the dictionary data base comprises a plurality of data items and a first one of the index data bases comprises a plurality of data item location identifiers which respectively identify the location of at least one data item in the dictionary data base and a second one of the index data bases includes a plurality of first location identifiers which respectively identify the location of at least one data item location identifier in the first index data base and a processing means, wherein the processing means is adapted to receive a first data stream including a plurality of first location identifiers and produce a second data stream including the data items without first location identifiers and wherein first location identifiers are replaced by corresponding data items.

It is preferred that the first data stream is adapted to be received by reading a data base.

The data base may be in a storage medium which is readable by a computer hardware device.

The data base may be stored in a computer memory.

The data stream preferably is transmitted and received from a communication system.

The first data stream may be received and stored in a data processor before being read and compressed or decompressed.

According to another aspect of the present invention there is provided a system which includes the system for compressing data and the system for retrieving data.

According to another embodiment of the present invention there is provided a storage medium having a computer program stored thereon which is adapted to control a computer to set up/implement the combined system.

According to another aspect of the present invention there is provided a method of encrypting data using the system for compressing data.

According to one embodiment of the method of encrypting data, the location of data items may be changed by using a coding means for changing the data item location identifiers in a reconvertible manner.

It is preferred that the data item location identifiers are able to be reordered so that the first location identifiers identify different data item location identifiers to those before reordering.

According to another embodiment of the present invention any one of the systems includes a scrambling means for reordering data item location identifiers in the first index data and for storing the method of reordering whereby the reordering can be reversed.

According to another aspect of the present invention there is provided a method of decryption using the system for retrieving data.

It is preferred that the method of decryption includes the scrambling means for reversing any reordering which has taken place of the dictionary item location identifiers.

According to another embodiment of the present invention the method of decryption includes a descrambling means which includes means for reversing any reordering of dictionary item location identifiers in the first index data base.

According to another embodiment of the present invention there is provided a method of encrypting and decrypting data which incorporates the combined system for compressing and retrieving data, the method also including the step of at predetermined times using a scrambling means to reorder dictionary item location identifiers in accordance with a predetermined ordering technique which is stored or able to be stored and received by a descrambling means at a receiving end of the system.

A preferred embodiment of the present invention will now be described by way of example only with reference to HTML script or text.

BEST MODE OF CARRYING OUT THE INVENTION

As an example the following HTML text will be minimised in accordance with the preferred embodiment of the invention:

The Frontpage install <!--webbot="PurpleText" preview="This page is created in the root directory of your FrontPage when FrontPage is installed. It contains information that allows users to edit pages in your web using the Microsoft Web Publishing Wizard or programs which use the Microsoft Web Publishing Wizard such as FrontPad using the same username and password they would use if they were authorising with Microsoft FrontPage. If you so not want to allow users to edit files on this web using tools other than Microsoft FrontPage, you can delete this file".

The above text can be split into a number of groups which for convenience will be referred to as data items. Thus the word "the" constitutes one data item, the word "frontpage" constitutes another data item and so on for the word "install", "<!--webbot bot=" and "PurpleText". In a typical situation each of the above data items would be stored in a data base and the space required to store this data is accordingly no longer available to store other data.

Using the miniaturisation technique in accordance with the present invention two indexing lists are set up as shown in FIG. 1.

A first list 11 is set up which is effectively a data base of pointers.

For convenience only some of the pointers are shown, being those pointers required to identify text which is stored relating to the sample of HTML text referred to above.

The first list 11 is generated by analysing the repetitive structure of HTML text and script that exists as documents or data transfer streams. This list has common HTML text type documents. All items that are of repetitive nature that can be identified exist in this list. This text list could be a super set of other common lists, for example, the English language list or the French language list.

A second list 12 contains a dictionary of the HTML text which is to be miniaturised. Each data item is located at a specific position in the list 12 and this position is identified by a number which is pointed to by a pointer from list 11.

The list 12 is effectively a dictionary data base which is generated by coding the entries in the HTML text and script list.

The 128 most common items are located first in the list and are assigned first level representation (typically 8 bits) in alphabetic sequence. The rest of the list is organised alphabetically and is assigned the minimum number of bits to uniquely identify the location of the original data in the list 11.

As an example, if the total number of data items (e.g. characters) in the first list is 29,456 then 15 bits (0.32768) would be needed to represent the unique location of the start of a particular data item. The number of unique entries is then calculated. If, for example, there are 3,128 unique entries in the list 11, then 12 bits (0 to 4096) will be required to identify the unique data items in the list.

It follows from the above that by setting up the first list 11 a reduced number of pointers are required to represent the data items in the second list, because data items that are repeated do not need to have an associated pointer.

Accordingly if a data item occurs 1,000 times in the second list or dictionary data base, a single pointer is all that is required in the first list 11 and accordingly the single pointer is all that needs to be stored in a general data base 13.

Thus referring back to the example of HTML text given above, the word "the" is the first data item which is to be stored in the general data base 13. Because the word "the" is a common word, it therefore occurs in the most common section of the second list 12 and may be located at position 3406. The corresponding pointer from the first list 11 may be located at position 8A. Accordingly the word "the" does not need to be stored in the general data base 13 nor does the second list pointer 3406. Instead the first list pointer 8A can be stored in the general data base 13 and this obviously has a lower number of bits required to describe it and accordingly requires less space for storage.

The next word in the HTML text is "Frontpage" which is not as common as the word "the", but does exist many times in normal HTML text. It therefore is located in the less common section of the dictionary list 12 at a location 23456. In the first list 11 location 23456 is represented by pointer 2408.

It follows therefore that pointer 2408 is placed in the general data base 13 straight after pointer BA. The word "install" is the next data item in the HMTL text and is an uncommon word which is located at position 26578. The corresponding pointer in first list 11 is located at position 2458. Accordingly this pointer 2458 is stored in the general data base 13 after pointer 2408.

Finally the script string "<!--webbot bot=" is a very common HTML script command and is therefore located at position 4987 in the second list. This location 4987 is represented by pointer 8F in the first list 11 and accordingly is located in the general data base 13 instead of the script "<!--webbot bot=".

The word "PurpleText" is not common in either HTML script or text and therefore does not occur in the dictionary list 12. As a result this word is represented by an exception flag "00" in the general data base 13 and has no associated pointer. Similarly any other script or text which is not represented in the dictionary data base 12, is also classified as an exception and is copied verbatim into the general data base 13.

Reconstruction of the original data represented in the general data base is simply achieved by using a reverse look-up algorithm.

Thus if the pointer 8A is read, a look-up algorithm is used to access the first list 11 which gives the location of the corresponding data item at location 3406 in the second list 12.

At location 3406 the word "the" is located and this word is then retrieved and substituted for the pointer 8A.

The above example discloses what is in effect a double index technique, utilising two pointers. However the present invention may equally be applicable to any number of indexes and pointers, depending on the data which is to be miniaturised. Thus one application would be in miniaturising data located in telephone white pages. In such a situation a number of dictionary lists would be required, such as a names list, a streets list and a locations list.

Each of these lists would have their own separate first and second list pointers using the examples outlined above. Furthermore, each list could have an associated list which would also require a double index pointer system.

Thus a streets list having the names of various streets may also require a sub-list of street types such as "ST", "PL", "CR" etc.

According to another example image data may be represented by multi-level indexing techniques. Thus the first level may be the fact that the area is black, the second level may indicate the shape, the third level may indicate the size. Similarly the levels may relate to further deconstruction of the original data.

Clearly the above compression technique is not limited to text based data, but is also able to be used in connection with foreign languages, foreign character sets (e.g. Arabic and Chinese), music and speech phonemes. The only requirement is that the data has a repetitive nature that can be analysed and represented as uniquely coded and identifiable items.

An important advantage of the miniaturisation technique which is described above lies with the ability to search data items in its miniaturised format. Thus instead of searching for the word "the" in the preferred embodiment given above, a search could be conducted for the pointer 8A. This is in contrast to conventional searching techniques of compressed text, where it is necessary to continually convert and reconvert text in order to complete the search.

Although the main focus of the present invention is miniaturisation of data, the invention is equally applicable to encrypting/decrypting data. This is because the indexing system described above in effect replaces common data items with associated pointers which act as tokens.

Because each token and data item is easily retrievable, the list of tokens/pointers can easily be manipulated in a reversible manner to make unauthorised decryption more difficult.

The present invention is therefore applicable to any data which includes repetitive elements. This is because these repetitive elements can be represented in an index of pointers/tokens which obviate the need for pointers for each repeated element. It follows therefore that theoretically any data stored, for example in computer memory can be stored in a miniaturised form by eliminating the majority of repeated data items.

The invention claimed is:

1. Using a data processor according to a sequence of instructions adapted to control the data processor, a method of compressing a dataset comprising:
   generating a dictionary database of data items from which data items of the dataset can be represented, wherein the dictionary database is readable by the data processor;
   allocating storage for a plurality of first location identifiers readable by the data processsor, wherein the dataset can be represented in compressed form by the plurality of first location identifiers and zero or more exception sequences not represented in the dictionary database;
   allocating storage for an identifier index comprising a plurality of second location identifiers readable by the data processor, wherein each second location identifier identifies a location in the dictionary database;
   reading the dataset using the data processor;
   parsing the dataset into a plurality of data items using the data processor;
   generating the plurality of first location identifiers and the plurality of second location identifiers from the dataset such that each of the plurality of first location identifiers points to a location in the identifier index and each of the second location identifiers points to a location in the dictionary database, to thereby form a compressed dataset comprising at least the dictionary database, the identifier index and a sequence of items representing the dataset, the sequence comprising an ordered set of items, wherein each item is a first location identifier when the item is represented in the dictionary database and is an exception sequence corresponding to data of the dataset when the data of the dataset is not represented in the dictionary database.

2. The method as claimed in claim 1, further comprising:
   scanning the compressed dataset to identify exception sequences that are not present in the dictionary database;
   adding a dictionary database entry for at least one exception sequence in the compressed dataset; and
   replacing, in the sequence of items representing the dataset, the at least one exception sequence with a first location identifier that points to a second location identifier that in turn points to the added dictionary database entry.

3. The method as claimed in claim 1, wherein data items include one or more of a string of data, a field of data or other group of data that can represent information in a predetermined format.

4. The method as claimed in claim 1, wherein data items represent streams of data that can be searched.

5. The method as claimed in claim 1, wherein the dictionary database includes a plurality of databases and wherein at least some of the first location identifiers point to locations to second location identifiers that point within more than one of the plurality of databases, thereby allowing for dictionary substitution without requiring modifications to the identifier index.

6. The method as claimed in claim 1, wherein the first location identifiers are pointers that have values indicative of an index number into the identifier index.

7. The method as claimed in claim 1, wherein the second location identifiers are pointers that have values indicative of an index number into the dictionary database wherein an initial symbol of a pointed-to data item resides.

8. The method as claimed in claim 1, further comprising reconstructing the dataset from the compressed dataset using a reverse look-up process that uses the compressed dataset's dictionary database, identifier index and sequence of items representing the dataset, the sequence comprising an ordered set of items, wherein each item is a first location identifier when the item is represented in the dictionary database and is an exception sequence corresponding to data of the dataset when the data of the dataset is not represented in the dictionary database.

* * * * *